(12) United States Patent
Hanya et al.

(10) Patent No.: US 10,912,201 B2
(45) Date of Patent: Feb. 2, 2021

(54) ELECTRONIC DEVICE AND PRODUCTION METHOD THEREOF

(71) Applicant: STANLEY ELECTRIC CO., LTD., Tokyo (JP)

(72) Inventors: Akihiko Hanya, Tokyo (JP); Tsukasa Imura, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 3 days.

(21) Appl. No.: 16/247,020

(22) Filed: Jan. 14, 2019

(65) Prior Publication Data

US 2019/0223292 A1 Jul. 18, 2019

(30) Foreign Application Priority Data

Jan. 17, 2018 (JP) ................. 2018-005871

(51) Int. Cl.
| | |
|---|---|
| *H05K 7/00* | (2006.01) |
| *H05K 7/12* | (2006.01) |
| *H05K 1/18* | (2006.01) |
| *H05K 3/12* | (2006.01) |
| *B22F 7/06* | (2006.01) |
| *H05K 3/30* | (2006.01) |
| *H05K 1/09* | (2006.01) |
| *B22F 1/00* | (2006.01) |
| *B22F 3/105* | (2006.01) |

(52) U.S. Cl.
CPC ............. *H05K 1/181* (2013.01); *B22F 7/062* (2013.01); *B22F 7/064* (2013.01); *H05K 1/092* (2013.01); *H05K 3/1283* (2013.01); *H05K 3/303* (2013.01); *B22F 1/0014* (2013.01); *B22F 3/105* (2013.01); *H05K 2203/1131* (2013.01)

(58) Field of Classification Search
CPC ........ H05K 1/181; H05K 1/092; H05K 3/303; H05K 3/1283; H05K 2203/1131; H05K 1/0209; H05K 3/3463; H05K 2201/0338; H05K 2201/0272; H05K 2201/0269; H05K 1/0271; B22F 7/062; B22F 7/064; B22F 3/105; B22F 1/0014; H01L 2224/83
See application file for complete search history.

(56) References Cited

U.S. PATENT DOCUMENTS

| | | | | |
|---|---|---|---|---|
| 6,828,669 | B2 * | 12/2004 | Iijima | ............... H01L 21/76885 |
| | | | | 174/250 |
| 9,516,749 | B2 * | 12/2016 | Wada | ..................... H05K 3/321 |
| 2008/0156398 | A1 * | 7/2008 | Yasuda | .................. B23K 35/34 |
| | | | | 148/23 |

(Continued)

FOREIGN PATENT DOCUMENTS

WO 2014006787 A1 1/2014

*Primary Examiner* — Yuriy Semenenko
(74) *Attorney, Agent, or Firm* — Holtz, Holtz & Volek PC

(57) ABSTRACT

Provided is an electronic device capable of supplying large current to a circuit pattern, without employing a thick film structure for the circuit pattern. The electronic device includes a substrate, a wiring layer placed on the upper surface of the substrate, an electronic component mounted above the wiring layer, and a bonding layer placed between the electronic component and the wiring layer. The wiring layer and the bonding layer are porous layers containing pores. The bonding layer has higher volume density than the wiring layer except underneath the electronic component.

16 Claims, 10 Drawing Sheets

(56) References Cited

U.S. PATENT DOCUMENTS

| | | | |
|---|---|---|---|
| 2016/0200045 A1* | 7/2016 | Hopkins | B33Y 10/00 |
| | | | 428/550 |
| 2017/0086303 A1* | 3/2017 | Ham | B32B 38/10 |
| 2017/0162436 A1* | 6/2017 | Arvin | H01L 24/81 |
| 2017/0317048 A1* | 11/2017 | Matsubara | B22F 7/08 |
| 2019/0054538 A1* | 2/2019 | Kato | B22F 7/002 |
| 2019/0103378 A1* | 4/2019 | Escher-Poeppel | H01L 24/81 |

* cited by examiner

ELECTRONIC DEVICE AND PRODUCTION METHOD THEREOF

FIELD OF THE INVENTION

The present invention relates to an electronic device including a substrate on which an electronic component is mounted.

DESCRIPTION OF THE RELATED ART

Conventionally, there are known various methods for mounting an electronic component on a substrate. By way of example, the international unexamined patent application No. 2014/006787 (hereinafter, referred to as "patent document 1") discloses an electronic device including a substrate, a wiring layer formed on a surface of the substrate, and an electronic component with a terminal, mounted on the surface of the substrate, where the terminal is embedded in the wiring layer and joined thereto. In this electronic device, the electronic component is mounted on the wiring layer formed by applying conductive particles to the substrate, and thereafter the substrate is irradiated with light, whereby the electronic component is joined to the substrate.

SUMMARY OF THE INVENTION

The method of forming the wiring layer by applying conductive particles and fusing the applied particles by light irradiation, allows fine drawing of the wiring layer. Therefore, high-density wiring can be achieved. As disclosed in the patent document 1, however, in the structure where the terminal is embedded in the wiring layer when the electronic component is joined to the wiring layer, it is necessary that the wiring layer and the electrode should be made of the same material. Furthermore, in the electronic device with this kind of configuration, heat generated when current flows in the electronic component does not easily escape therefrom. Accordingly, large current cannot be applied to the electronic component, resulting in that uses of this electronic device are limited.

An aspect of the present invention is to provide an electronic device that is capable of supplying large current to the electronic component.

An electronic device of the present invention includes, a substrate, a wiring layer placed on an upper surface of the substrate, an electronic component mounted above the upper surface of the wiring layer, and a bonding layer placed between the electronic component and the wiring layer. The wiring layer and the bonding layer are porous layers containing pores. The bonding layer has higher volume density than the wiring layer except underneath the electronic component.

According to the present invention, heat generated from the electronic component is conducted at high efficiency through the bonding layer with high volume density, and further conducted to the substrate and discharged therefrom. Therefore, this allows supplying of large current to the electronic component.

DESCRIPTION OF THE PREFERRED EMBODIMENTS

There will now be described one embodiment of an electronic device of the present invention.

Figure 1A:
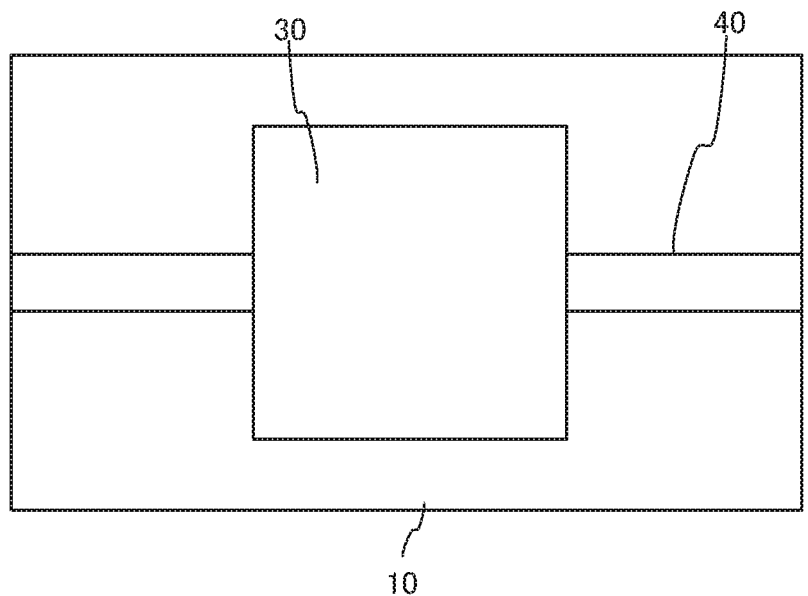
FIG. 1A is a top view of an electronic device and FIG. 1B is a cross-sectional view thereof according to a first embodiment.
Figure 1B:
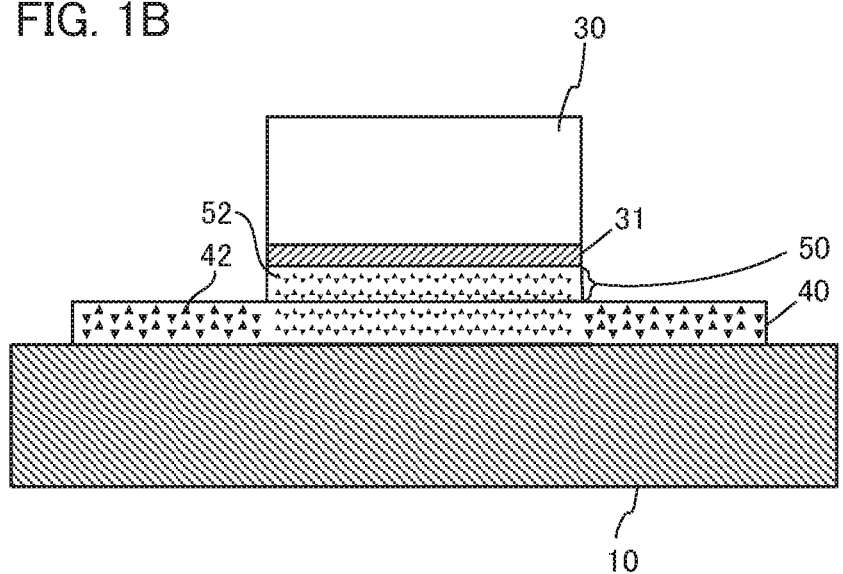

FIG. 1A is a top view of the electronic device and FIG. 1B is a cross-sectional view thereof according to a first embodiment. In the present embodiment, the electronic device includes, a substrate 10, a wiring layer 40 formed on the upper surface of the substrate 10, an electronic component 30 mounted above the wiring layer 40, and a bonding layer 50 placed between the electronic component 30 and the wiring layer 40. The wiring layer 40 and the bonding layer 50 are electrically-conductive and porous layers containing pores 42 and 52, respectively. The bonding layer 50 has higher volume density than the wiring layer 40 except underneath (directly under) the electronic component 30. The volume density here indicates a ratio of a conductive material constituting the bonding layer 50 and/or the wiring layer 40 in the volume of the layers, and the higher is the volume density, the higher becomes the ratio of the volume of metal (conductive material) constituting the layer, relative to the overall layer, that is, the density of the layer becomes higher. In other words, the layer with higher volume density shows a smaller ratio of pores in the layer. In FIG. 1, the pores 42 and 52 are schematically illustrated in the shape of triangle, but actual pores 42 and 52 may be shaped randomly.

Since the bonding layer 50 has higher volume density than the wiring layer 40 except underneath the electronic component 30, the bonding layer 50 has conductivity higher than the wiring layer 40 except underneath the electronic component 30. Therefore, heat generated from the electronic component 30 when current is supplied thereto, is conducted at high efficiency through the bonding layer 50 with high volume density, further conducted to the substrate, and discharged therefrom. This allows supplying of large current to the electronic component 30.

In addition, the volume density of the wiring layer 40 is lower than the bonding layer 50, and thus the wiring layer 40 is high in elasticity. Therefore, even when thermal expansion of the substrate 10 applies tension to the substrate 10, the substrate 10 is bent, or when thermal shock is applied thereto, the wiring layer 40 can absorb those kinds of force. Accordingly, this provides the electronic device with highly reliable wiring.

Preferably, both the wiring layer 40 and the bonding layer 50 may be obtained by sintering conductive particles. In the present embodiment, conductive particles are accumulated and sintered, thereby forming the wiring layer 40 and the bonding layer 50. This forming method will be described later.

As discussed so far, since both of the wiring layer 40 and the bonding layer 50 can be formed by sintering the conductive particles, this allows simplification of production steps.

A first conductive particle constituting the wiring layer 40 and a second conductive particle constituting the bonding layer 50 may be the same type or different types. Preferably, the type of the first conductive particle should be identical to the type of the second conductive particle, since uniformity between the wiring layer 40 and the bonding layer 50 is particularly favorable.

Hereinafter, specific embodiments will be described.

First Embodiment

The electronic device as shown in FIG. 1 includes a substrate 10, a wiring layer 40 formed on the upper surface of the substrate 10, an electronic component 30 mounted above the upper surface of the wiring layer 40, a bonding layer 50 placed between the electronic component 30 and the wiring layer 40, configured to bond the wiring layer 40 to an electrode 31 of the electronic component 30. The wiring layer 40 and the bonding layer 50 are electrically-conductive and porous layers containing pores 42 and 52. Volume density of the pores 52 of the bonding layer 50 is lower than the volume density of the pores 42 in the wiring layer 40. In other words, the bonding layer 50 is an extremely fine layer, containing conductive particles with higher volume density than the wiring layer 40.

Furthermore, in the wiring layer 40, in the part underneath the electronic component 30, the size of the pores is smaller than the remaining part, i.e., other than the part underneath the electronic component 30, and the size is equivalent to the size of pores 52 in the bonding layer 50. Therefore, the wiring layer 40 underneath the electronic component 30 has a structure equivalent to the bonding layer 50, and it is continuous to the bonding layer 50. Accordingly, in the following, the wiring layer underneath the electronic component 30 is also referred to as the bonding layer 50.

In other words, the wiring layer 40 is electrically connected to the electrode 31 of the electronic component 30 via the bonding layer 50. The electronic device of the present embodiment has the electronic component 30, the electrode 31, and the bonding layer 50, having the same dimensions when viewed from the top, and the side surfaces thereof are aligned. However, the dimensions of the electronic component 30, the electrode 31, and the bonding layer 50, viewed from the top, are not necessarily identical. In addition, the wiring layer 40 is bonded to the side surface of the bonding layer 50, and the bonding layer 50 is thicker than the wiring layer 40.

A part or all of the wiring layer 40 and the bonding layer 50 comprise a layer obtained by sintering conductive particles. A solution where conductive particles are dispersed in a solvent is applied to the substrate 10, and a film containing the conductive particles is formed and then sintered by light irradiation, or the like, in a desired region, whereby the wiring layer 40 and the bonding layer 50 are formed. A method for forming the wiring layer 40 and the bonding layer 50 will be described later.

When the wiring layer 40 is supplied with current from a power source, not illustrated, which is placed outside the substrate 10, the current flows into the electronic component 30 via the bonding layer 50 and the electrode 31.

Next, there will be described a method for producing the electronic device as shown in FIG. 1.

First Production Method of the First Embodiment

Figure 2A:
FIGS. 2A to 2E illustrate a first production method of the electronic device according to the first embodiment.

With reference to FIG. 2A, a method for producing the electronic device according to the first embodiment will be described.

As shown in FIG. 2A, in the first production method, the substrate 10 is prepared, and in order to form the wiring layer 40, there is prepared a first solution where the aforementioned first conductive particles are dispersed in a solvent.

The first solution is applied to the upper surface of the substrate 10 in a desired shape. For example, by using a print method, a coated film is formed in the shape of the wiring layer 40. The print method to be employed may include, ink jet printing, flexographic printing, gravure offset printing, and screen printing. The first solution thus applied produces a surface being smooth or a convex meniscus, and forms a coated film (the first film 41).

Figure 2B:
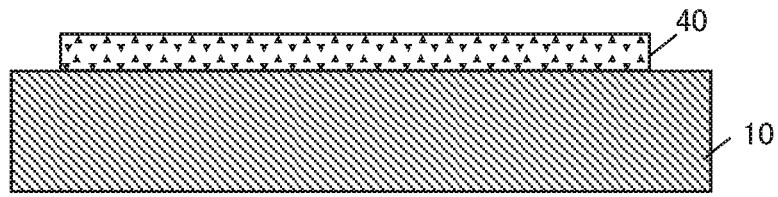

Next, as shown in FIG. 2B, the first conductive particles in the film 41 are sintered, thereby forming a layer of conductive particles (wiring layer 40).

When the first conductive particles are sintered by light irradiation, light irradiation in a desired pattern is performed to sinter the conductive particles. When the substrate 10 is light transparent, any sides of the substrate 10 can be irradiated with light, from the upper surface or from the undersurface. If the substrate 10 is not light transparent, the substrate 10 is irradiated with light from the upper surface. With the light irradiation, the conductive particles melt at a temperature lower than a melting point of bulk material constituting the particles. The first conductive particles may be sintered according to a method other than the light irradiation, such as heating, or both the light irradiation and a method other than the light irradiation may be used for sintering the first conductive particles.

The light being radiated in this step may have any wavelength, such as ultraviolet, visible, infrared light and microwave. Light with a wavelength absorbable by the first conductive particle contained in the film 41 should be selected for use. The wiring layer 40 can be formed by passing the light through a mask with an opening. When materials such as Ag, Cu, and Au are employed for the conductive particle, visible light in the range from 400 to 600 nm can be used, for instance. In addition, light beams collected into an irradiation diameter smaller than a wiring width of the wiring layer 40 may be employed, allowing the light beams to scan a predetermined pattern on the film 41.

The first conductive particles being melted by sintering are fused directly with adjacent particles. Accordingly, the conductive particles are sintered with one another, thereby forming electrically conductive wiring layer 40.

Next, in order to form the bonding layer 50, there is prepared a second solution where the aforementioned second conductive particles are dispersed in a solvent. The second conductive particle used for the second solution is smaller in particle diameter relative to the first conductive particle. The solvent used for the second solution may be the same as the solvent used for the first solution, or may be different therefrom.

Figure 2C:
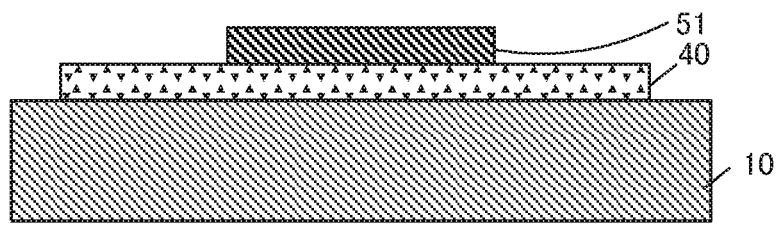

The second solution is applied in a desired shape, on a part of the upper surface of the wiring layer 40. As shown in FIG. 2C, the second solution thus applied produces a surface being smooth or a convex meniscus on the wiring layer 40, and forms a coated film (film 51). The film 51 may be heated as required, and then dried, so as to raise the concentration of the conductive particles. Within the film 51, the second conductive particles are being dispersed.

Figure 2D:
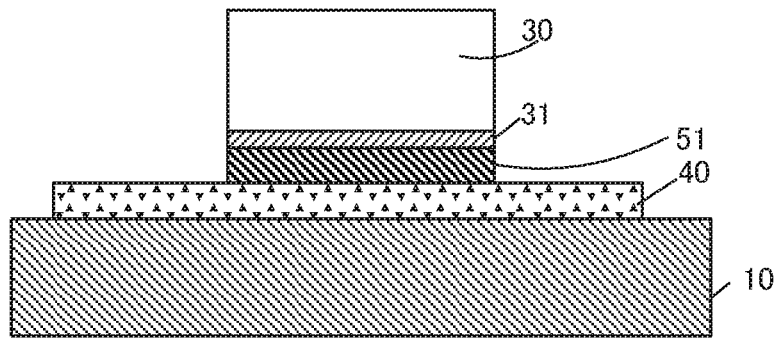

As shown in FIG. 2D, the electronic component 30 is mounted in a manner that the electrode 31 is aligned with the film 51.

Figure 2E:
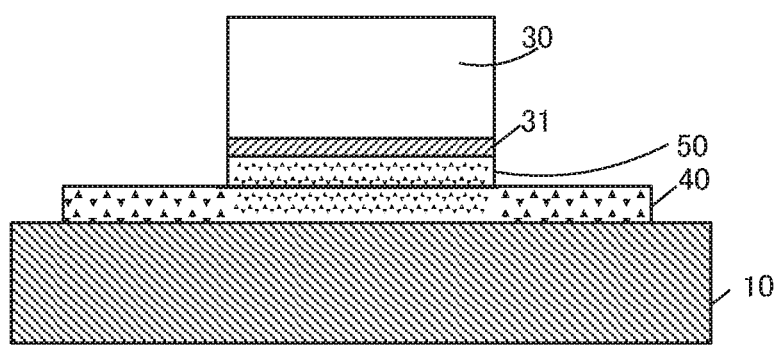

Next, the first conductive particles in the wiring layer 40 underneath the electronic component 30 are sintered. At this time, the second conductive particles in the film 51 are sintered simultaneously. Sintering is performed under the condition that the size of the pores in the wiring layer 40 underneath the electronic component 30 becomes equivalent or almost equivalent to the size of the pores in the bonding layer 50. Accordingly, as shown in FIG. 2E, the bonding layer 50 and the wiring layer 40 underneath the electronic component 30 form equivalent pores, and they are united, thereby forming the conductive particle layer (bonding layer 50).

Specifically, when sintering is performed by light irradiation, this sintering can be performed by light irradiation on a part underneath the electronic component 30 where the bonding layer 50 is positioned, from the backside of the substrate 10. For this case, it is preferable to use the substrate 10 that is light transparent. Sintering may be performed according to a method other than light irradiation. For example, a position where the bonding layer 50 is formed is heated from the backside of the substrate 10, or the electronic component 30 is heated, thereby sintering the first conductive particles and the second conductive particles. A method to be employed for forming the bonding layer 50 by heating the electronic component 30 may include, for instance, a method that heats a tool (e.g., tweezers) used when the electronic component 30 is mounted on the film 51, and a method that performs heating by applying laser, or the like, to the surface of the electronic component 30. When sintering is performed by a method other than the light irradiation, any substrate 10 may be used, a substrate which is light transparent or a substrate without light transparency. Sintering may be performed according to both the light irradiation and a method other than the light irradiation, such as heating.

A specific method of light irradiation is the same as the method of light irradiation on the first conductive particles, and thus redundant descriptions will not be provided.

In the aforementioned method, the first conductive particle in the first solution is larger than the second conductive particle in the second solution. Therefore, the time for light irradiation on the film 41 or heating the film 41 is made longer, and energy is more intensified, relative to the light irradiation on the film 51 or heating the film 51. Accordingly, this allows the size of the pores contained in the bonding layer 50 to be equivalent to the size of those in the wiring layer 40 in a part underneath the electronic component 30.

According to the sintering step as shown in FIG. 2E, the electrode 31 of the electronic component 30 is bonded to the bonding layer 50, and the side surfaces of the bonding layer 50 are bonded to the wiring layer 40 on the substrate 10.

In the aforementioned production method, the second conductive particle used in the second solution has a diameter smaller than that of the first conductive particle, but the first conductive particle and the second conductive particle may have the same diameter. In addition, the first solution and the second solution may be the same solution. When the first conductive particle in the first solution and the second conductive particle in the second solution may be the same in particle diameter, the film 51, and the film 41 underneath the electronic component 30 are sintered under the same condition, thereby easily producing the pores equivalent in size, to form the bonding layer 50. In this case, the time for light irradiation on or heating the conductive particles that form the bonding layer 50 may be made longer, and energy is more intensified, relative to the time for light irradiation on or heating the conductive particles that form the wiring layer 40 except underneath the electronic component 30, thereby achieving formation of the bonding layer 50 with higher volume density than the wiring layer 40.

The conductive particles are sintered with one another according to the methods as described above, whereby this allows formation of the bonding layer 50 with higher volume density than the wiring layer 40, irrespective of whether the diameter of the first conductive particle in the first solution is the same as or different from the diameter of the second conductive particle in the second solution. By forming the bonding layer 50, the electronic component 30 is joined to the substrate 10 via the bonding layer 50.

Second Production Method of the First Embodiment

With reference to FIG. 3, the second production method will be described.

The second production method is the same as the first production method in the point that the wiring layer 40 and the bonding layer 50 are formed by sintering, but it is different in the point that both films for forming the films 41 and 51 are applied in advance, and then, the sintering step is performed thereon. In the following, the steps equivalent to the steps in the first production method will not be described in detail.

Figure 3A:
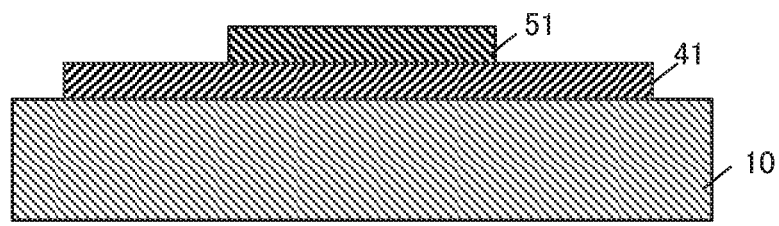
FIG. 3A to 3D illustrate a second production method of the electronic device according to the first embodiment.

As shown in FIG. 3A, in the second production method, firstly the substrate 10 is prepared, and then, the first solution and the second solution are prepared. The first solution and the second solution may be the same solution, or different solutions.

The first solution is applied to the upper surface of the substrate 10 in a desired shape. The first solution thus applied produces a surface being smooth or a convex meniscus on the substrate 10, and forms the film 41. The second solution is applied to at least apart of the upper surface of the film 41. The second solution thus applied produces a surface being smooth or a convex meniscus, thereby forming the film 51.

Figure 3B:
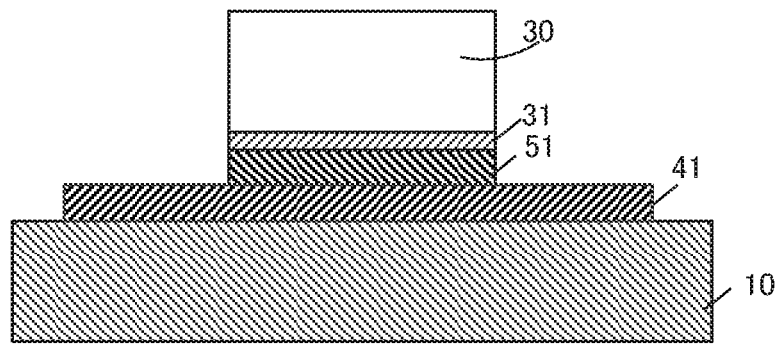

As shown in FIG. 3B, the electronic component 30 is mounted in a manner that the electrode 31 is in alignment with the film 51.

Figure 3C:
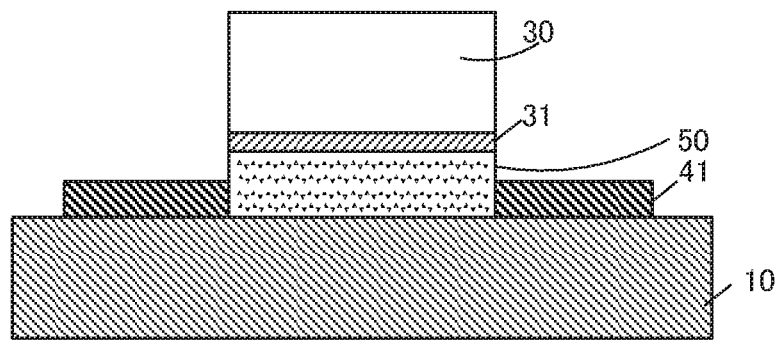

Next, as shown in FIG. 3C, the second conductive particles in the film 51 and the first conductive particles in the film 41 underneath the electronic component 30 are sintered, thereby forming a conductive particle layer (bonding layer 50).

Specifically, sintering is firstly performed by light irradiation on or heating a position where the bonding layer 50 is formed, and the bonding layer 50 is formed underneath the electronic component 30. By way of example, a position where the bonding layer 50 is formed and its surroundings including the position are sintered by light irradiation. In addition, the backside of the substrate 10 can be irradiated with light to perform sintering. In this case, it is preferable to use the substrate 10 that is light transparent.

The bonding layer 50 underneath the electronic component 30 may be sintered according to a method other than the light irradiation, such as heating. In that case, the substrate 10 may be heated from the backside, or the electronic component 30 may be heated. Both a method other than the light irradiation, and the light irradiation, may be employed for the sintering.

When the first conductive particle in the first solution is larger than the second conductive particle in the second solution, the pores that form the bonding layer 50 may become equivalent in size, by extending the time of light irradiation or heating, or by intensifying energy for the first conductive particle. When the first conductive particle in the first solution and the second conductive particle in the second solution are the same in particle diameter, the film 51 and the film 41 underneath the electronic component 30 are simultaneously sintered, thereby easily achieving an equivalent size of the pores that form the bonding layer 50. In this case, the time for light irradiation on or heating the conductive particles that form the bonding layer 50 is made longer, and energy is more intensified, relative to the time for light irradiation on or heating the conductive particles that form the wiring layer 40 except underneath the electronic component 30, thereby achieving formation of the bonding layer 50 with higher volume density than the wiring layer 40.

As thus described, by sintering the conductive particles with one another, the bonding layer 50 with higher volume density than the wiring layer 40 can be formed, irrespective of whether the diameter of the first conductive particle in the first solution is the same as or different from the diameter of the second conductive particle in the second solution. Accordingly, by forming the bonding layer 50, the electronic component 30 is joined to the substrate 10 via the bonding layer 50.

Figure 3D:
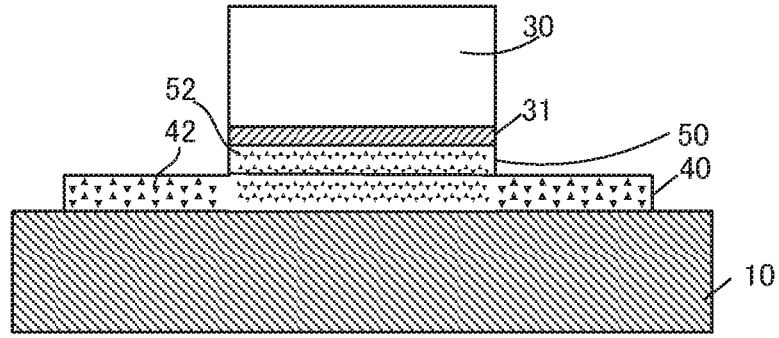

After the electronic component 30 is joined thereto, as shown in FIG. 3D, the first conductive particles in the film 41 except underneath the electronic component 30 are sintered, and a conductive particle layer (wiring layer 40) is formed. In this case, conditions for the sintering are provided so that density of the wiring layer 40 becomes lower than the density of the bonding layer 50, and density of the pores 42 becomes higher than the density of the pores 52. For example, the wiring layer 40 may be formed under the conditions, such as setting the temperature to be lower than the temperature at which the bonding layer 50 is formed. At least one method may be employed to perform sintering in the wiring layer 40; either by light irradiation or by a method other than the light irradiation.

According to the sintering step as shown in FIG. 3D, the bonding layer 50 is bonded to the undersurface of the electrode 31 of the electronic component 30. The wiring layer 40 is bonded to at least a part of the side surface of the bonding layer 50.

In the second production method, the sintering step for forming the bonding layer 50 and the sintering step for forming the wiring layer 40 can be performed continuously, and thus this enables reduction of the production time.

In this production method, it is possible to reverse the sequence of the sintering step for forming the bonding layer 50 as shown in FIG. 3C, and the sintering step for forming the wiring layer 40 as shown in FIG. 3D. That is, after the electronic component 30 is mounted on the film 51, the first conductive particles in the film 41 are sintered to form the wiring layer 40. Thereafter, sintering is performed to form the bonding layer 50, by light irradiation on or by heating from the backside of the substrate 10, a position where the bonding layer 50 is formed and the surroundings including the position.

In this production method, the film 51 is formed after forming the film 41, but this is not the only procedure. It is alternatively possible to form the film 41 and the film 51 in a collective manner, according to mask printing or a similar method.

In the first and the second production methods, any of the first and the second conductive particles sintered by executing the steps for forming the wiring layer 40 and the bonding layer 50, are joined with one another, keeping a certain particle shape, thereby forming the wiring layer 40 and the bonding layer 50 as porous layers containing the pores 42 and 52, respectively. In addition, the bonding layer 50 has higher volume density than the wiring layer 40 except underneath the electronic component 30. In other words, the volume density of the bonding layer 50 becomes higher than the volume density of the wiring layer 40 except underneath the electronic component 30.

In the first and the second production methods, the wiring layer 40 and the bonding layer 50 can be formed through simple steps, i.e., applying of solution and sintering. In addition, the wiring layer 40, and the bonding layer 50 that has higher volume density than the wiring layer 40, can be formed continuously. Therefore, heat generated from the electronic component 30 is conducted efficiently through the bonding layer 50 and the wiring layer 40 to the substrate 10, and discharged therefrom.

Then in the first and the second production methods, sintering to form the bonding layer 50 is performed in the state that the electronic component 30 is mounted, and therefore, bonding between the bonding layer 50 and the electronic component 30, and formation of the bonding layer 50 can be performed simultaneously. Furthermore, sintering is performed with the electronic component 30 being mounted, achieving reliable bonding between the electrode 31 of the electronic component 30 and the bonding layer 50.

In the electronic device of the present embodiment, sintering is performed to form the wiring layer 40 and the bonding layer 50, and this achieves high-density wiring, enabling high-density packaging. In addition, since the wiring layer 40 is bonded to the bonding layer 50 that has high volume density, the bonding layer 50, being low in resistance, allows supplying of large current to the electronic component 30. Therefore, this produces an effect such as increasing the number of the mountable electronic components 30, and widening the variety thereof. The electronic device can be produced, with various electronic components mounted on the substrate 10 at high densities, and collectively implemented through a fewer number of production steps.

As a material of the substrate 10, any material may be used, which is capable of supporting the wiring layer 40 and the bonding layer 50, at least the surface thereof is provided with an insulation property, and further it is resistant to sintering upon forming the wiring layer 40. By way of example, there may be employed a material such as a polyethylene terephthalate (PET) substrate, a polyethylene naphthalate (PEN) substrate, a glass epoxy substrate, a paper phenol substrate, a flexible print substrate, a ceramic substrate, a glass substrate, and a metal substrate with a surface coated with an insulating layer. When conductive particles are sintered by light irradiation, it is preferable to employ the substrate 10 being light transparent. In that case, it is possible to irradiate the backside of the substrate with the light for sintering the wiring layer 40 and the bonding layer 50. In addition, a film type substrate can also be used as the substrate 10.

The substrate 10 may have a curved shape. In this case, though not illustrated, the wiring layer 40 and the bonding layer 50 are placed along the curved surface of the substrate 10. In the present embodiment, films containing conductive particles are applied and sintered, so as to form the wiring layer 40 and the bonding layer 50, and further the wiring layer 40 is a porous layer containing large pores 42. Therefore, a circuit pattern on the curved substrate 10 can be easily formed, without any wire break or line thinning, by curving the substrate 10 at least prior to the sintering step for forming the bonding layer 50.

As a material of the conductive particles constituting the wiring layer 40 and the bonding layer 50, at least one of the conductive metal such as Ag, Cu, Au, Pt, and Ni may be employed. The material of the wiring layer 40 and the material of the bonding layer 50 may be the same or may be different. As a solvent where the conductive particles are dispersed, an organic solvent or water may be used.

The wiring layer 40 contains the first conductive particle with a particle diameter equal to or between 0.001 μm and 1 μm. The wiring width of the wiring layer 40 may be 1 μm or more, for instance. The wiring layer 40 may be formed with a thickness equal to or between 1 nm and 10 μm, or so. In addition, resistivity of the wiring layer 40 is preferably $10^{-4}$ Ω·cm or less, and in particular, low resistance in the order of $10^{-6}$ Ω·cm is desirable.

The bonding layer 50 contains the second conductive particle with a particle diameter equal to or between 0.001 μm to 1 μm. The bonding layer 50 may be formed with the wiring width of 1 μm or more, for example, around 20 μm. The bonding layer 50 may be formed with the thickness equal to or between 1 μm and 10 μm or so, for example, around 5 μm. In addition, resistivity of the bonding layer 50 is preferably $10^{-4}$ Ω·cm or less, and in particular, low resistance in the order of $10^{-6}$ Ω·cm is desirable.

Any component may be employed as the electronic component 30. Byway of example, there may be employed following components, such as a light emitting element (LED, and LD), a light receiving element, an integrated circuit, and a display element (such as EL display), resistance, capacitor, and transistor. Further in FIG. 1, only one electronic component 30 is mounted on the substrate 10, but it is of course possible to mount more than one electronic component 30. In this case, the wiring layer 40 may be formed in a manner that multiple electronic components 30 can be connected in a desired circuit pattern such as in series and in parallel.

Second Embodiment

Figure 4:
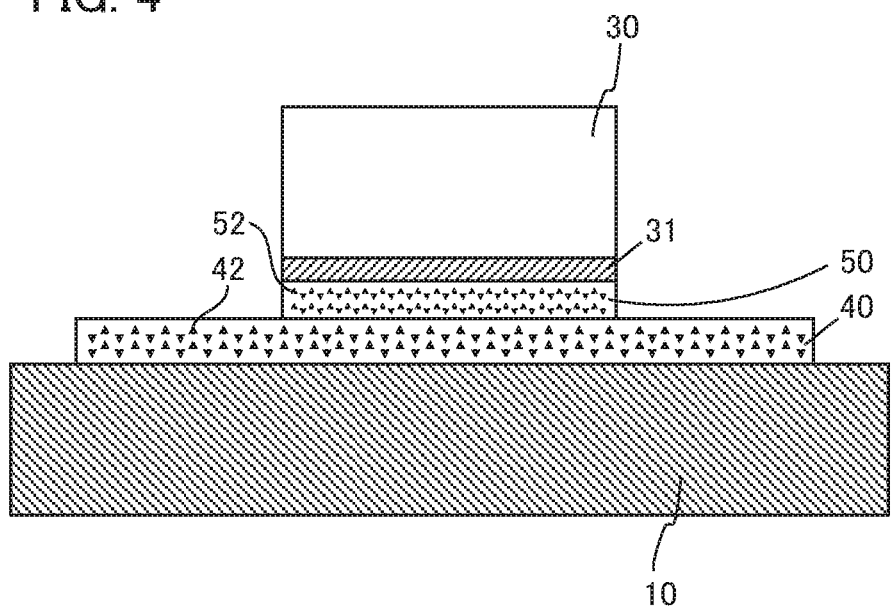
FIG. 4 is a cross-sectional view of the electronic device according to a second embodiment.

With reference to FIG. 4, there will now be described the electronic device according to the second embodiment. This electronic device is different from the first embodiment in the point that the bonding layer 50 is bonded to the upper surface of the wiring layer 40. The other configurations are the same as those of the electronic device according to the first embodiment, including the substrate 10, the wiring layer 40 formed on the upper surface of the substrate 10, the electronic component 30 above the wiring layer 40, and the bonding layer 50 placed between the electronic component 30 and the wiring layer 40. The wiring layer 40 and the bonding layer 50 are porous layers containing the pores 42 and 52. The bonding layer 50 has higher volume density than the wiring layer 40. Therefore, heat generated from the electronic component 30 is conducted efficiently through the bonding layer 50 and the wiring layer 40, to the substrate 10 and discharged therefrom, and thus this allows supplying of large current to the electronic component 30. In the electronic device of the present embodiment, the electronic component 30, the electrode 31, and the bonding layer 50 have the same dimensions when viewed from the top, and the side surfaces thereof are aligned. However, the dimensions of the electronic component 30, the electrode 31 and the bonding layer 50 are not necessarily identical when viewed from the top.

First Production Method of the Second Embodiment

With reference to FIG. 5, there will be described the first production method of the electronic device according to the second embodiment. In the first production method of the electronic device according to the second embodiment, steps from the initial step to the step of FIG. 2D are the same as those in the first production method of the electronic device according to the first embodiment. However, the step of FIG. 5E is different from the step of FIG. 2E, in the point that the bonding layer 50 is formed on the upper surface of the wiring layer 40. There will now be described the steps as shown in the figures from FIG. 5A to FIG. 5D only briefly, since they are the same as the steps in the first production method of the electronic device according to the first embodiment.

Figure 5A:
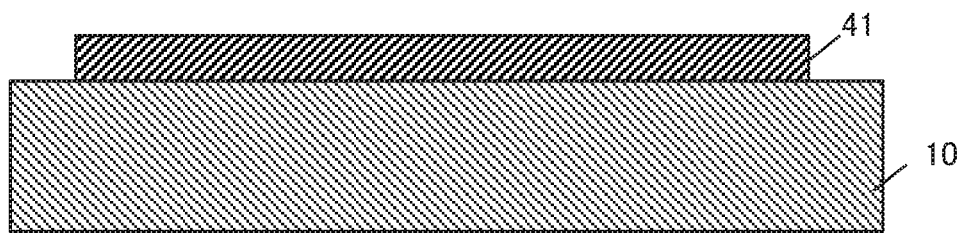
FIGS. 5A to 5E illustrate the first production method of the electronic device according to the second embodiment.

In the first production method of the electronic device according to the second embodiment, firstly as shown in FIG. 5A, the first solution is applied to the upper surface of the substrate 10, in a desired shape. The first solution thus applied produces a surface being smooth or a convex meniscus on the substrate 10 and forms the first film 41.

Figure 5B:
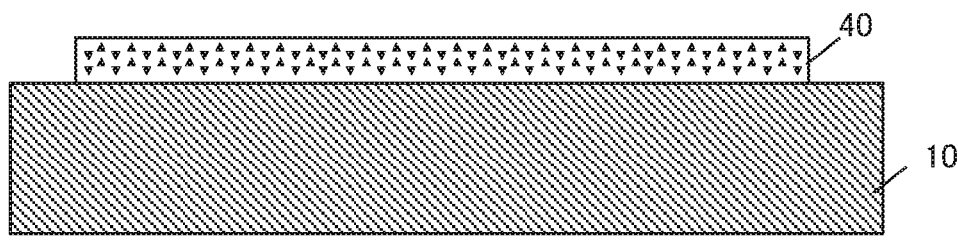

Next, as shown in FIG. 5B, the first conductive particles in the film 41 are sintered, and then the wiring layer 40 is formed. This sintering may be performed by light irradiation, or by a method other than the light irradiation, such as heating. Alternatively, those methods may be combined.

Then, the second solution is applied to a part of the upper surface of the wiring layer 40, in a desired shape. The particle diameter of the second conductive particle used for the second solution may be smaller than the particle diameter of the first conductive particle, or it may be the same as the particle diameter of the first conductive particle. The solvent used for the second solution may be the same as, or different from, the solvent used for the first solution.

Figure 5C:
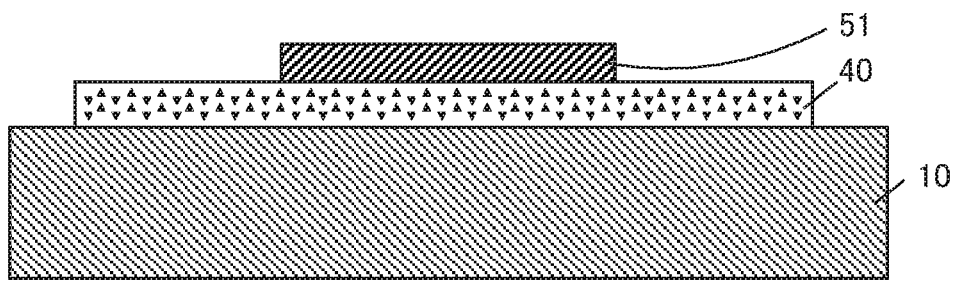

As shown in FIG. 5C, the second solution thus applied produces a surface being smooth or a convex meniscus on the wiring layer 40, and then the film 51 is formed. The film 51 may be heated as required, and then dried, so as to raise the concentration of the conductive particles.

Figure 5D:
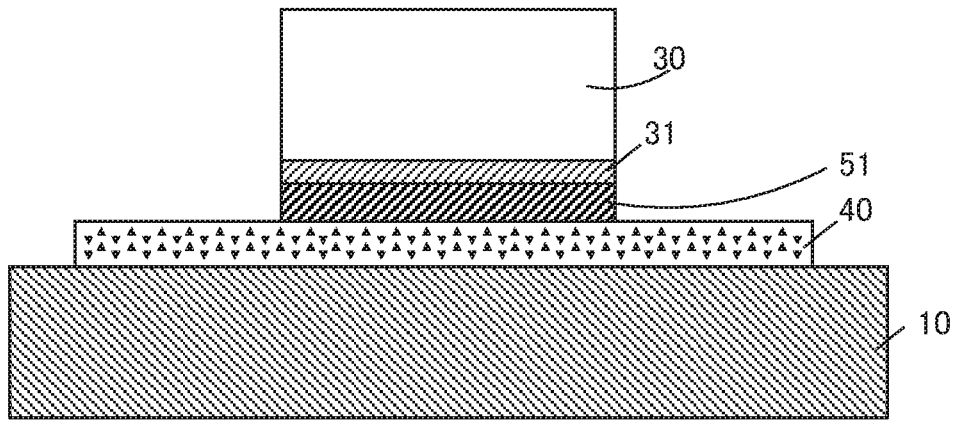

As shown in FIG. 5D, the electronic component 30 is mounted, in a manner that the electrode 31 is aligned with the film 51.

Figure 5E:
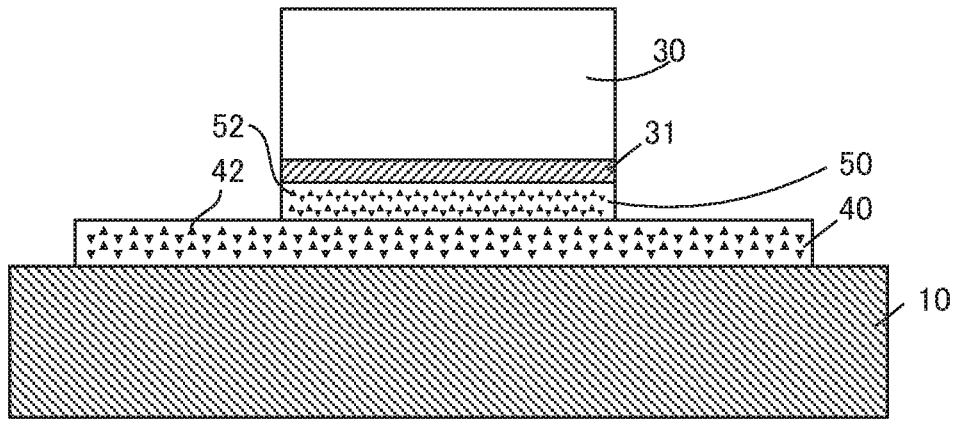

Next, as shown in FIG. 5E, the second conductive particles in the film 51 are sintered, so as to form the bonding layer 50. At this time, this sintering is performed under the condition that the size of the pores 52 in the bonding layer 50 becomes smaller than the size of the pores 42 in the wiring layer 40. Accordingly, the second conductive particles are sintered so that the density of the pores 52 in the bonding layer 50 becomes lower than the density of the pores 42 in the wiring layer 40.

Specifically, when the sintering is performed by light irradiation, the film 51 or the surroundings including the film 51 is irradiated with the light from the backside of the substrate 10, thereby sintering the second conductive particles. In this case, it is preferable to employ the substrate 10 being light transparent. A specific method for the light irradiation is the same as the method described in the first embodiment, and therefore, detailed descriptions thereof will not be provided redundantly.

The bonding layer 50 may be formed by a method other than the light irradiation, such as heating. The same method as described in the first embodiment may be employed as the method for heating the electronic component 30. When sintering is performed according to the method other than light irradiation, the substrate 10 may be any of the types, light transparent or not light transparent. It is to be noted that both light irradiation and a method other than the light irradiation can be used for the sintering.

When the second conductive particles in the second solution are smaller than the first conductive particles in the first solution, the volume density of the bonding layer 50 can be made higher than the volume density of the wiring layer 40, without extending the time of light irradiation on or heating the bonding layer 50, relative to the time of light irradiation on and heating the wiring layer 40, nor without intensifying energy. When the particle diameter of the first conductive particle in the first solution is the same as that of the second conductive particle in the second solution, sintering of the bonding layer 50 should proceed further, in order to raise the volume density of the bonding layer 50 to be higher than the volume density of the wiring layer 40. Therefore, when light irradiation is performed, preferably, sintering should be performed concurrently with heating the electronic component 30. When the first conductive particle in the first solution has the same particle diameter as that of the second conductive particle in the second solution and sintering is performed by heating, the volume density of the bonding layer 50 can be easily raised higher than the volume density of the wiring layer 40, by heating the electronic component 30.

According to the production method as described above, the bonding layer 50 is formed on at least a part of the upper surface of the wiring layer 40 on the substrate 10, and the bonding layer 50 is bonded to the electrode 31 of the electronic component 30.

Second Production Method of the Second Embodiment

With reference to FIG. 6, there will be described the second production method of the electronic device according to the second embodiment.

Figure 6A:
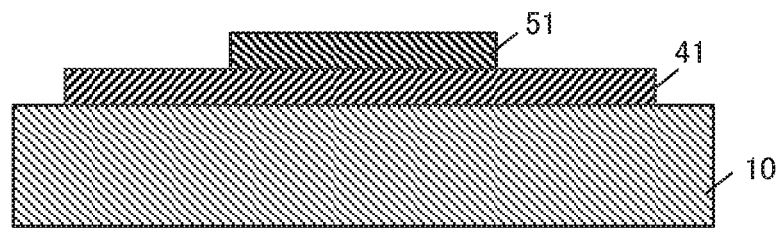
FIG. 6A to 6D illustrate the second production method of the electronic device according to the second embodiment.
Figure 6B:
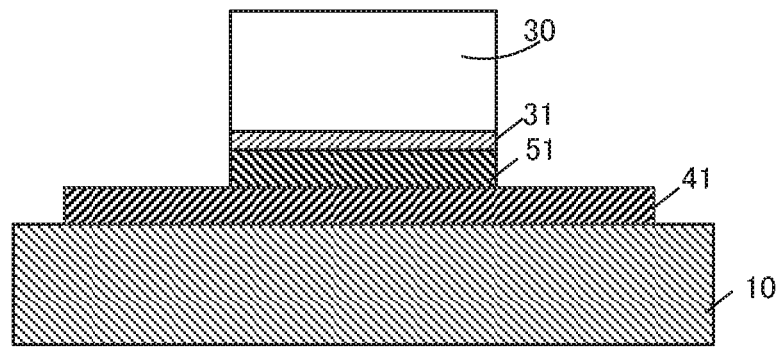
Figure 6C:
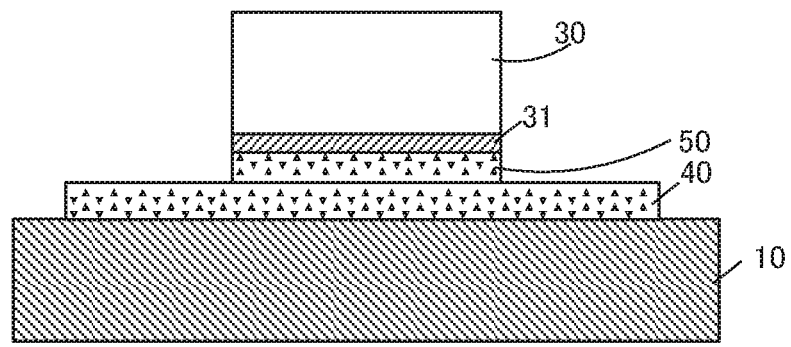

In the second production method of the electronic device according to the second embodiment, steps from the initial step to the step of FIG. 3B are the same as those in the second production method of the electronic device according to the first embodiment, and the step of FIG. 6C is different from the step of FIG. 3C in the point that the bonding layer 50 is formed after forming the wiring layer 40. There will now be described the steps as shown in the figures from FIG. 6A to FIG. 6B only briefly, since they are the same as the steps in the second production method of the electronic device according to the first embodiment.

Firstly as shown in FIG. 6A, the first solution is applied to the upper surface of the substrate 10, in a desired shape. The first solution thus applied produces a surface being smooth or a convex meniscus on the substrate 10, and the film 41 is formed. The second solution is applied to at least a part of the upper surface of the film 41. The second solution thus applied produces a surface being smooth or a convex meniscus on the wiring layer 40, and the film 51 is formed. The first solution and the second solution may be the same solution, or different solution. In this production method, the film 41 and the film 51 may be formed in a collective manner, according to mask printing or a similar method.

As shown in FIG. 6B, the electronic component 30 is mounted in a manner that the electrode 31 is aligned with the film 51.

Next, as shown in FIG. 6C, the second conductive particles in the film 51 and the first conductive particles in the film 41 are sintered, thereby forming the wiring layer 40.

Specifically, for the sintering to form the wiring layer 40, at least either one of the sintering methods may be employed, i.e., sintering by light irradiation, or sintering by a method other than the light irradiation. When the substrate 10 is light transparent, the substrate 10 may be irradiated with light, from any of the sides, the upper surface or the undersurface. When the substrate 10 is not light transparent, the substrate should be irradiated with light from the upper surface.

Figure 6D:
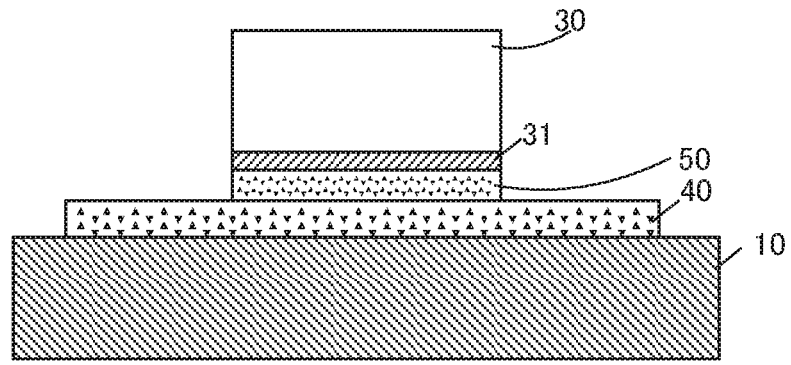

Next, as shown in FIG. 6D, sintering is performed by light irradiation on or heating a position where the bonding layer 50 is formed above the substrate 10, thereby forming the bonding layer 50 on the upper surface of the wiring layer 40, and underneath the electronic component 30. The position where the bonding layer 50 is formed and the surroundings including the position may be irradiated with light or heated to perform sintering. By sintering the conductive particles with one another according to the methods as described above, the bonding layer 50 being electrically conductive can be formed.

Specifically, when sintering is performed by the light irradiation, the position where the bonding layer 50 is formed and the surroundings including the position are irradiated with light, from the backside of the substrate. When the particle diameter of the second conductive particle constituting the bonding layer 50 is smaller than the particle diameter of the first conductive particle constituting the wiring layer 40, the volume density of the bonding layer 50 can be made higher than the volume density of the wiring layer 40, without extending the time of light irradiation on or heating the bonding layer 50, relative to the time of light irradiation on or heating the wiring layer 40, nor without intensifying energy. When the particle diameter of the first conductive particle is the same as that of the second conductive particle, it is necessary to further proceed sintering of the bonding layer 50, in order to raise the volume density of the bonding layer 50 to be higher than the volume density of the wiring layer 40. Therefore, preferably, sintering should be performed concurrently with heating the electronic component 30.

When sintering is performed by a method other than light irradiation, sintering should be performed concurrently with heating or a similar process on the electronic component 30, irrespective of the particle diameters of the first conductive particle and of the second conductive particle. With this procedure, the volume density of the bonding layer 50 can be easily raised, relative to the volume density of the wiring layer 40.

According to the sintering, the electronic component 30 is joined to the wiring layer 40 on the substrate 10 via the bonding layer 50.

In the second production method, the sintering step for forming the wiring layer 40, and the sintering step for forming the bonding layer 50 can be performed continuously, and thus this enables reduction of the production time.

In this production method, it is possible to reverse the sequence of the sintering step of the bonding layer 50 as shown in FIG. 6C, and the sintering step of the wiring layer 40 as shown in FIG. 6D. That is, after the electronic component 30 is mounted on the film 51, the second conductive particles in the film 51 may be sintered to form the wiring layer 50, prior to sintering the first conductive particles in the film 41 to form the wiring layer 40.

In the first and the second production methods, any of the first and the second conductive particles sintered by executing the steps for forming the wiring layer 40 and the bonding layer 50, are joined with one another, keeping a certain particle shape, thereby forming the wiring layer 40 and the bonding layer 50 as porous layers containing the pores 42 and 52, respectively. In addition, the bonding layer 50 has density of pores, lower than that of the wiring layer 40. That is, the volume density of the bonding layer 50 becomes higher than the volume density of the wiring layer 40.

Third Embodiment

Figure 7:
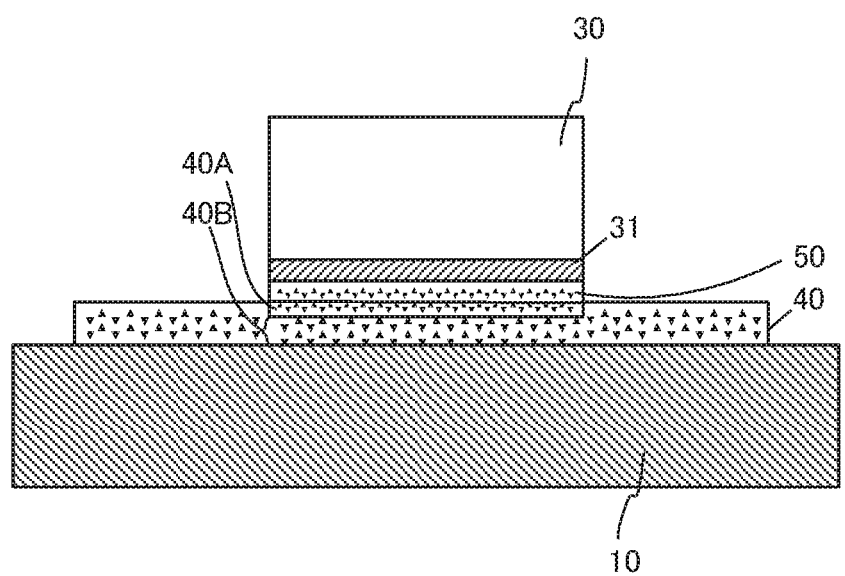
FIG. 7 is a cross-sectional view of the electronic device according to the third embodiment.

With reference to FIG. 7, there will now be described the electronic device of the third embodiment. This electronic device is different from the above mentioned embodiments in the point that the wiring layer 40 underneath the electronic component 30 has a double layer structure in the thickness direction, and the volume density of the layer 40A on the side in contact with the bonding layer 50 is higher than the volume density of the layer 40B on the side in contact with the substrate 10. Preferably, the layer 40A of the wiring layer 40 on the side in contact with the bonding layer 50 has the volume density equivalent to that of the bonding layer 50, and the layer 40B of the wiring layer 40 on the side in contact with the substrate 10 has the volume density equivalent to the volume density of the wiring layer 40 except underneath the electronic component 30. This establishes a structure that a lower part of the bonding layer 50 is embedded in the wiring layer 40. In other words, the overall undersurface of the bonding layer 50 and at least a part of the side surface thereof are bonded to the wiring layer 40. The other configurations are the same as those of the electronic device according to the second embodiment, and the electronic device includes the substrate 10, the wiring layer 40 formed on the upper surface of the substrate 10, the electronic component 30 having the electrode 31, mounted above the wiring layer, and the bonding layer 50 placed between the electronic component 30 and the wiring layer 40 that are arranged one above the other. The electronic device of the present embodiment includes the electronic component 30, the electrode 31, and the bonding layer 50, having the same dimensions when viewed from the top, and the side surfaces thereof are aligned. However, the dimensions of the electronic component 30, the electrode 31, and the bonding layer 50 viewed from the top are not necessarily identical.

For the electronic device of the present embodiment, the production method of the electronic device according to the second embodiment can be employed. Specifically, when the wiring layer 40 and the bonding layer 50 are sintered by light irradiation, the substrate 10 is irradiated with light from the backside. When the conductive particle with a particle diameter larger than that of the second film 51 is used for the first film 41, the particle size of those layers may be adjusted in advance so that the layer 40A of the wiring layer 40 and the bonding layer 50 after sintered may have pores equivalent in size, or the bonding layer 50 may be sintered concurrently with heating the electronic component 30. As a method for heating the electronic component 30, the same method as described in the first embodiment may be employed. Also in the case where the bonding layer 50 is sintered by light irradiation and conductive particles having the same particle diameter are used for the wiring layer 40 and the bonding layer 50, it is only required to perform sintering concurrently with heating the electronic component 30.

On the other hand, when the bonding layer 50 is sintered by a method other than the light irradiation, the time for heating the electronic component 30 above the substrate 10 is extended longer, or the heating temperature is made higher, relative to the step for forming the bonding layer 50 in the second embodiment. According to the method as described above, the electronic device of the present invention can be produced, in the state that a part of the bonding layer 50 on the substrate 10 side is embedded in the wiring layer 40.

In the electronic device of the present embodiment, the contact area between the bonding layer 50 and the wiring layer 40 is larger relative to the other embodiments. Therefore, heat generated from the electronic component 30 is efficiently conducted to the wiring layer 40, and further conducted to the substrate 10 and discharged therefrom. This configuration allows supplying of much larger current to the electronic component 30.

In addition, since the contact area between the bonding layer 50 and the wiring layer 40 is enlarged, rigid bonding of the electronic component 30 to the substrate 10 and to the wiring layer 40 can be achieved. Therefore, even when the substrate 10 is thermally expanded or any tension is applied thereto, it is possible to obtain the electronic device with rigid bonding of the electronic component 30 to the substrate 10 and to the wiring layer 40.

Fourth Embodiment

Figure 8:
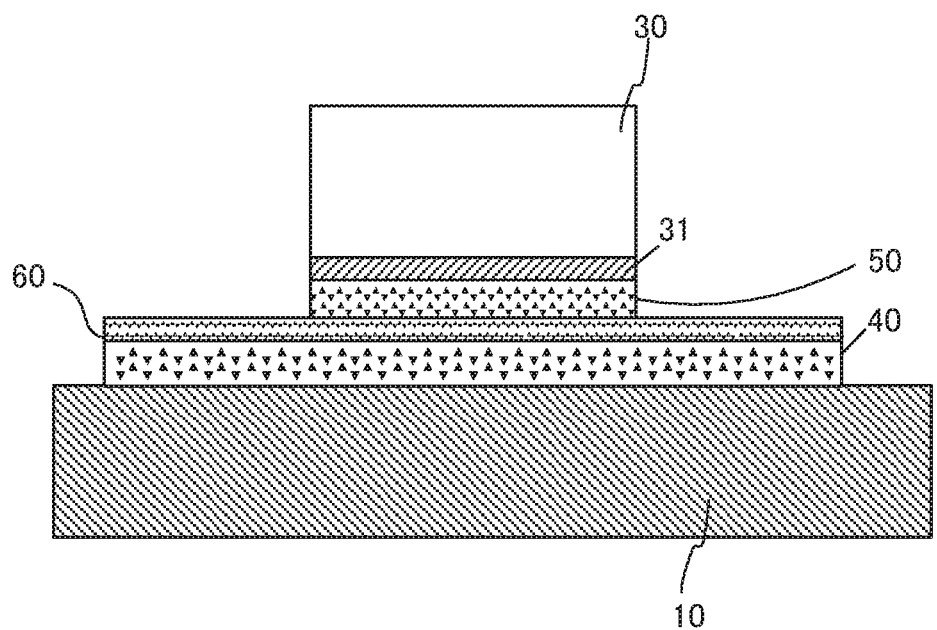
FIG. 8 is a cross-sectional view of the electronic device according to a fourth embodiment.

With reference to FIG. 8, there will now be described the electronic device of the fourth embodiment. This electronic device is different from the aforementioned embodiments in the point that a closely-packed thin film layer 60 comprising conductive particles is provided on at least a part of the upper surface of the wiring layer 40. In other words, the wiring layer 40 is provided on the upper surface of the substrate 10, the closely-packed thin film layer 60 is provided on the upper surface of the wiring layer 40, the bonding layer 50 is provided on the upper surface of the thin film layer 60, and the electrode 31 of the electronic component 30 is bonded to the upper surface of the bonding layer 50. The thin film layer 60 has higher volume density than the bonding layer 50. The other configurations are the same as those of the electronic device according to the second embodiment.

As the production method of the electronic device of the present embodiment, the first production method of the electronic device according to the second embodiment can be employed. In this production method, after the substrate 10 and the wiring layer 40 are formed, a thin film containing conductive particles with a diameter smaller than the conductive particles in the bonding layer 50 is applied to the upper surface of the wiring layer 40, according to screen printing, ink-jet printing, Gravure offset printing, or similar printing method, thereby forming the thin film layer 60. The thin film layer 60 can be formed by electroplating or electroless plating, or by sintering. When the thin film layer 60 is formed by sintering, the diameter of the conductive particles used in the thin film layer 60 is not necessarily smaller than the diameter of the conductive particles in the bonding layer 50, and a closely-packed structure may be produced only by sintering. After the thin film layer 60 is formed, the bonding layer 50 is formed according to the same method as described in the second embodiment.

Since the thin film layer 60 with this kind of closely packed structure has high thermal conductivity, heat generated from the electronic component 30 is easily conducted to the thin film layer 60 via the bonding layer 50. Therefore, with the thin film layer 60 thus provided on the upper surface of the wiring layer 40, heat generated from the electronic component 30 is efficiently conducted to the wiring layer 40, further conducted to the substrate 10, and then discharged therefrom. Accordingly, this allows supplying of much larger current to the electronic component 30.

Using the same metal for the conductive particles in the thin film layer 60 and in the bonding layer 50 allows enhancement of bonding strength on the interface between the thin film layer 60 and the bonding layer 50.

When the metal used for conductive particle in the thin film layer 60 is different from the conductive particles in the wiring layer 40 and in the bonding layer 50, thermal conductivity can be enhanced by choosing a metal with higher thermal conductivity for the conductive particle in the thin film layer, relative to the conductive particle in the wiring layer 40. Furthermore, choosing as the conductive particle in the thin film layer 60, a metal with corrosion-resistance higher than the conductive particle used in the wiring layer 40, allows enhancement of bonding strength between the thin film and the bonding layer 50.

When values of a thermal expansion coefficient and an elasticity coefficient of the thin film layer 60 are, respectively, between the thermal expansion coefficient values of the bonding layer 50 and the wiring layer 40, and between the elasticity coefficient values of the bonding layer 50 and the wiring layer 40, the thin film layer 60 is effective for easing the tension that is applied to the substrate 10.

In the present embodiment, the thin film layer 60 covers all over the upper surface of the wiring layer 40, but this is not the only example. The thin film layer 60 may only be provided on at least a part of the upper surface of the wiring layer 40, and for example, it may have the same dimensions as the undersurface of the bonding layer 50. Alternatively, it may be larger than the undersurface of the bonding layer 50 to some extent, and may be smaller than the upper surface of the wiring layer 40. The electronic device of the present embodiment includes the electronic component 30, the electrode 31, and the bonding layer 50 having the same dimensions when viewed from the top, and the side surfaces thereof are aligned, but the dimensions of the electronic component 30, the electrode 31, and the bonding layer 50 viewed from the top are not necessarily identical.

Fifth Embodiment

Figure 9:
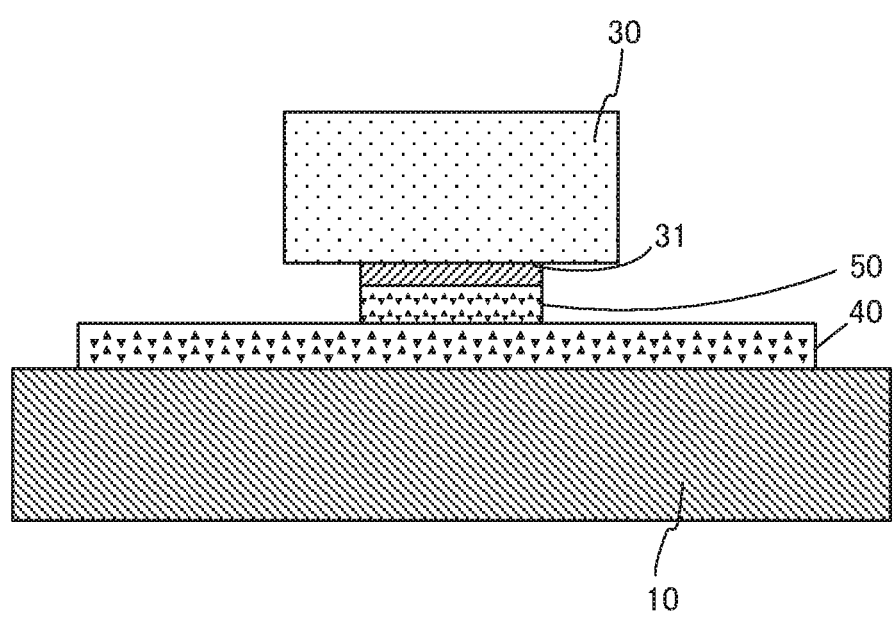
FIG. 9 is a cross-sectional view of the electronic device according to a fifth embodiment.

With reference to FIG. 9, there will now be described the electronic device according to the fifth embodiment. This electronic device is different from the aforementioned embodiments in the point that the electrode 31 is smaller in size, relative to the undersurface of the electronic component 30. In this situation, the size of the bonding layer 50 is also reduced in agreement with the size of the electrode 31, thereby reducing the cost of material used for the bonding layer 50. Alternatively, the area of the bonding layer 50 may be larger than the electrode 31, so as to facilitate dissipation of heat produced from the electronic component 30 toward the substrate 10. The other configurations of the electronic device are the same as the aforementioned embodiments, and the electronic device includes the substrate 10, the wiring layer 40 formed on the upper surface of the substrate 10, the electronic component 30 mounted above the upper surface of the wiring layer 40, and the bonding layer 50 placed between the electronic component 30 and the wiring layer 40.

In FIG. 9, the bonding layer 50 is bonded to the upper surface of the wiring layer 40. However, as described in the first embodiment, the wiring layer 40 underneath the bonding layer 50 may have the same volume density as the bonding layer 50, and both layers may be united as the bonding layer 50.

The electronic device of the present embodiment may have a configuration similar to the electronic device of the third embodiment where a lower part of the bonding layer 50 is embedded in the wiring layer 40. Furthermore, the electronic device of the present embodiment may have a configuration similar to the electronic device of the fourth embodiment where the thin film layer 60 with a higher density than the bonding layer 50 is provided on at least a part of the upper surface of the wiring layer 40.

The electronic device of the present embodiment includes the electrode 31 in a size smaller than the undersurface of the electronic component 30, and the size of the bonding layer 50 is the same as the size of the electrode 31, but this is not the only example. For example, the electronic device of the present embodiment may have the electrode 31 in a size equal to the size of the undersurface of the electronic component 30, and the bonding layer 50 may be smaller than the electrode 31.

Since the production method of the electronic device of the present embodiment is the same as the production method of the electronic device as described in the aforementioned first to the fourth embodiments, redundant explanations will not be provided.

Sixth Embodiment

Figure 10:
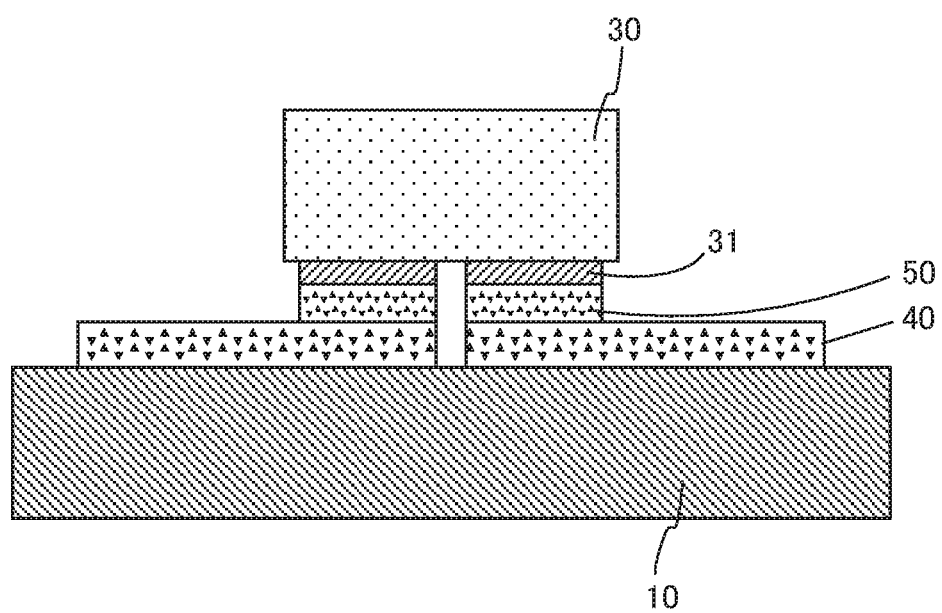
FIG. 10 is a cross-sectional view of the electronic device according to a sixth embodiment.

With reference to FIG. 10, the electronic device of the sixth embodiment will be described. This electronic device is different from the electronic device of the aforementioned embodiments in the point that the electronic component 30 is provided with more than one electrode 31. In this situation, the same number of the wiring layers 40 and the bonding layers 50 are provided in accordance with the number of the electrodes 31, the surface area of the bonding layer 50 is increased, thereby facilitating dissipation of heat generated from the electronic component 30, via the bonding layer 50 toward the substrate 10. The other configurations of the electronic device of the present embodiment are the same as the aforementioned embodiments, including the substrate 10, the wiring layer 40 formed on the upper surface of the substrate 10, the electronic component 30 mounted above the upper surface of the wiring layer 40, and the bonding layer 50 placed between the electronic component 30 and the wiring layer 40.

As shown in FIG. 10, in the electronic device of the sixth embodiment, the bonding layers 50 are bonded to the upper surface of the wiring layers 40. However, similar to the electronic device of the first embodiment, the wiring layer 40 underneath the bonding layer 50 may have the same volume density as the bonding layer 50, and both layers may be united as the bonding layer 50.

The electronic device of the sixth embodiment may have a configuration similar to the electronic device of the third embodiment where a lower part of the bonding layer 50 is embedded in the wiring layer 40. In addition, the electronic device of the sixth embodiment may have a configuration similar to the electronic device of the fourth embodiment where the thin film layer 60 with a higher density than the bonding layer 50 is provided on at least a part of the upper surface of the wiring layer 40. The electronic device of the sixth embodiment includes the electrode 31 and the bonding layer 50 having the same dimensions when viewed from the top, and the side surfaces thereof are aligned. However, the dimensions of the electrode 31 and the bonding layer 50 viewed from the top are not necessarily identical.

Since the production method of the electronic device in the present embodiment is the same as the production method of the electronic device as described in the aforementioned first to the fifth embodiments, redundant explanations will not be provided.

The electronic device of the present embodiment is applicable to any device that includes a substrate on which an electronic component is mounted. By way of example, it is applicable to a device such as an instrument panel of a vehicle, and a monitor of a gaming machine. Since the substrate is allowed to bend, it is applicable to a wearable (body wearable) electronic device (such as glasses, a watch, a display, and medical equipment), and a curved display.

What is claimed is:

1. An electronic device comprising:
   a substrate;
   a wiring layer on an upper surface of the substrate;
   an electronic component mounted above the wiring layer; and
   a bonding layer between the electronic component and the wiring layer,
   wherein:
   the wiring layer and the bonding layer are porous layers containing pores,
   the wiring layer comprises a portion that is directly under the electronic component, and another portion that is not directly under the electronic component, and
   a volume density of the bonding layer is higher than a volume density of said another portion of the wiring layer that is not directly under the electronic component.

2. The electronic device according to claim 1, wherein a volume density of said portion of the wiring layer that is directly under the electronic component is equal to the volume density of the bonding layer.

3. The electronic device according to claim 1, wherein the bonding layer is formed on at least a part of an upper surface of the wiring layer.

4. The electronic device according to claim 1, wherein said portion of the wiring layer that is directly under the electronic component has a double layer structure in a thickness direction, including a first part that is in contact with the bonding layer and a second part that is in contact with the substrate, and
   wherein a volume density of the first part that is in contact with the bonding layer is higher than a volume density of the second part that is in contact with the substrate.

5. The electronic device according to claim 1, further comprising:
   a thin film layer provided on at least a part of an upper surface of the wiring layer,
   wherein the bonding layer is provided on an upper surface of the thin film layer, and
   wherein a volume density of the thin film layer is higher than the volume density of the bonding layer.

6. The electronic device according to claim 1, wherein an upper surface of the bonding layer is smaller in area than an undersurface of the electronic component.

7. The electronic device according to claim 6, wherein more than one bonding layer is provided.

8. The electronic device according to claim 1, wherein the bonding layer and the wiring layer comprise sintered conductive particles.

9. The electronic device according to claim 8, wherein the conductive particles constituting the bonding layer have a smaller particle diameter than the conductive particles constituting the wiring layer.

10. The electronic device according to claim 1, wherein the volume density of the bonding layer is higher than a volume density of said portion of the wiring layer that is directly under the electronic component.

11. A production method of an electronic device, comprising:
    forming a first film by applying a first solution to an upper surface of a substrate in a desired shape, the first solution containing a first conductive particle dispersed in a solvent,
    forming a wiring layer by sintering the first film,
    forming a second film by applying a second solution to a part of an upper surface of the wiring layer in a desired shape, the second solution containing a second conductive particle dispersed in a solvent, and the second conductive particle having a smaller diameter than the first conductive particle, and
    forming a bonding layer for joining the wiring layer to an electrode of an electronic component, by sintering the second film after mounting the electronic component with the electrode on the second film,
    wherein:
    the wiring layer and the bonding layer are formed as porous layers containing pores,
    the wiring layer comprises a portion that is positioned to be directly under the electronic component, and another portion that is not positioned to be directly under the electronic component, and
    a volume density of the bonding layer is higher than a volume density of said another portion of the wiring layer that is not positioned to be directly under the electronic component.

12. The production method of the electronic device according to claim 11 wherein forming the bonding layer includes sintering by light irradiation on the second film or surroundings including the second film.

13. The production method of the electronic device according to claim 11, wherein forming the bonding layer includes sintering by heating the electronic component.

14. A production method of an electronic device, comprising:
    forming a first film by applying a first solution to an upper surface of a substrate in a desired shape, the first solution containing a first conductive particle dispersed in a solvent,
    forming a second film by applying a second solution to a part of an upper surface of the first film in a desired shape, the second solution containing a second conductive particle dispersed in a solvent, and the second conductive particle having a smaller particle diameter than the first conductive particle,
    forming a wiring layer by sintering the first film, after an electronic component with an electrode is mounted on the second film, and
    forming a bonding layer by sintering the second film, so that the wiring layer is joined to the electrode of the electronic component,
    wherein:
    the wiring layer and the bonding layer are formed as porous layers containing pores,
    the wiring layer comprises a portion that is directly under the electronic component, and another portion that is not directly under the electronic component, and
    a volume density of the bonding layer is higher than a volume density of said another portion of the wiring layer that is not directly under the electronic component.

15. The production method of the electronic device according to claim 14, wherein forming the bonding layer includes sintering by light irradiation on the second film or surroundings including the second film.

16. The production method of the electronic device according to claim 14, wherein forming the bonding layer includes sintering by heating the electronic component.

* * * * *